United States Patent
Hormuth et al.

(10) Patent No.: US 8,902,593 B2
(45) Date of Patent: Dec. 2, 2014

(54) SYSTEM AND METHOD FOR COUPLING INFORMATION HANDLING SYSTEMS IN A MODULAR CHASSIS

(75) Inventors: Robert W. Hormuth, Cedar Park, TX (US); Jimmy D. Pike, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 350 days.

(21) Appl. No.: 13/444,587

(22) Filed: Apr. 11, 2012

(65) Prior Publication Data
US 2013/0271904 A1 Oct. 17, 2013

(51) Int. Cl.
*G06F 1/16* (2006.01)

(52) U.S. Cl.
USPC .......................................... 361/725; 710/104

(58) Field of Classification Search
USPC ............... 361/725, 727; 710/104, 65
See application file for complete search history.

(56) References Cited

U.S. PATENT DOCUMENTS

| | | | |
|---|---|---|---|
| 6,088,224 A * | 7/2000 | Gallagher et al. | 361/695 |
| 6,148,352 A * | 11/2000 | Coale et al. | 710/100 |
| 6,310,783 B1 * | 10/2001 | Winch et al. | 361/797 |
| 6,751,094 B2 * | 6/2004 | Kolb et al. | 361/679.33 |
| 6,909,923 B2 * | 6/2005 | Vasko et al. | 700/79 |
| 7,083,422 B2 * | 8/2006 | Campini et al. | 439/61 |
| 7,996,583 B2 * | 8/2011 | Wilkinson | 710/33 |
| 8,335,075 B2 * | 12/2012 | Zhang | 361/679.33 |
| 8,373,982 B2 * | 2/2013 | Zhang | 361/679.33 |
| 8,527,803 B2 * | 9/2013 | Paul et al. | 713/503 |
| 8,576,570 B2 * | 11/2013 | Nguyen et al. | 361/730 |
| 8,644,667 B2 * | 2/2014 | Katayama et al. | 385/135 |
| 8,694,693 B2 * | 4/2014 | Lambert et al. | 710/11 |
| 8,700,923 B2 * | 4/2014 | Fung | 713/300 |
| 2005/0262269 A1 * | 11/2005 | Pike | 710/1 |
| 2006/0092928 A1 * | 5/2006 | Pike et al. | 370/355 |
| 2008/0259555 A1 * | 10/2008 | Bechtolsheim et al. | 361/686 |
| 2012/0116590 A1 * | 5/2012 | Florez-Larrahondo et al. | 700/275 |
| 2012/0159029 A1 * | 6/2012 | Krishnan et al. | 710/301 |

* cited by examiner

*Primary Examiner* — Lisa Lea Edmonds
(74) *Attorney, Agent, or Firm* — Baker Botts L.L.P.

(57) ABSTRACT

A system may include a chassis and a chassis backplane integral to the chassis. The chassis may be configured to receive a plurality of server backplanes, each server backplane integral to a respective modular sled configured to removably engage with the chassis. The server backplane may include a plurality of information handling systems, a switch communicatively coupled to each of the information handling systems, at least one external network port communicatively coupled to the switch for coupling the switch to an external network external to the chassis, and a plurality of internal network ports communicatively coupled to the switch. The chassis backplane may have a topology configured to couple the switch from each server backplane to switches from two or more other server backplanes such that an internal chassis network is formed comprising the information handling systems and switches of the plurality of server backplanes engaged with the chassis.

14 Claims, 3 Drawing Sheets

SYSTEM AND METHOD FOR COUPLING INFORMATION HANDLING SYSTEMS IN A MODULAR CHASSIS

TECHNICAL FIELD

The present disclosure relates in general to information handling systems, and more particularly to coupling information handling systems in a modular chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often times implemented within a modular chassis. In such implementations, a modular chassis may be configured to receive a plurality of individual server sleds. Each server sled may be adapted to removably couple both mechanically and electronically to the chassis via an appropriate bay of the chassis (e.g., by sliding the sled in or out of the bay). Each sled may include one or more information handling systems and other information handling resources or electronically coupling the one or more information handling resources to other components of the chassis.

Traditional approaches to coupling information handling systems within a modular chassis to a communications network external to the chassis have many disadvantages. For example, some traditional approaches employ a switch external to the chassis to provide such connectivity. As another example, some traditional approaches employ a switch embedded in the chassis of a size that equals the maximum number of sleds or information handling systems that could ever be inserted. One disadvantages of these approaches is the tax on the chassis infrastructure if one is not using all of the ports from the external switch or one does not fully populate the chassis bays.

SUMMARY

In accordance with the teachings of the present disclosure, the disadvantages and problems associated with providing video overlay information for an integrated chassis housing a plurality of modular information handling systems.

In accordance with embodiments of the present disclosure, a system may include a chassis and a chassis backplane integral to the chassis. The chassis may be configured to receive a plurality of server backplanes, each server backplane integral to a respective modular sled configured to removably engage with the chassis. The server backplane may include a plurality of information handling systems, a switch communicatively coupled to each of the plurality of information handling systems, at least one external network port communicatively coupled to the switch for coupling the switch to an external network external to the chassis, and a plurality of internal network ports communicatively coupled to the switch. The chassis backplane may have a topology configured to couple the switch from each server backplane to switches from two or more other server backplanes such that an internal chassis network is formed comprising the information handling systems and switches of the plurality of server backplanes engaged with the chassis.

In these and other embodiments, a server backplane configured to be carried on a modular sled for engagement with a chassis may include a plurality of information handling systems, a switch communicatively coupled to each of the plurality of information handling systems, at least one external network port communicatively coupled to the switch for coupling the switch to an external network external to the chassis, and a plurality of internal network ports communicatively coupled to the switch. The plurality of internal network ports may be configured to communicatively coupled to a chassis backplane integral to the chassis. The chassis backplane may have a topology configured to couple the switch from each server backplane to switches from two or more other server backplanes such that an internal chassis network is formed comprising the information handling systems and switches of the plurality of server backplanes engaged with the chassis.

Technical advantages of the present disclosure will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-3B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

Figure 1:
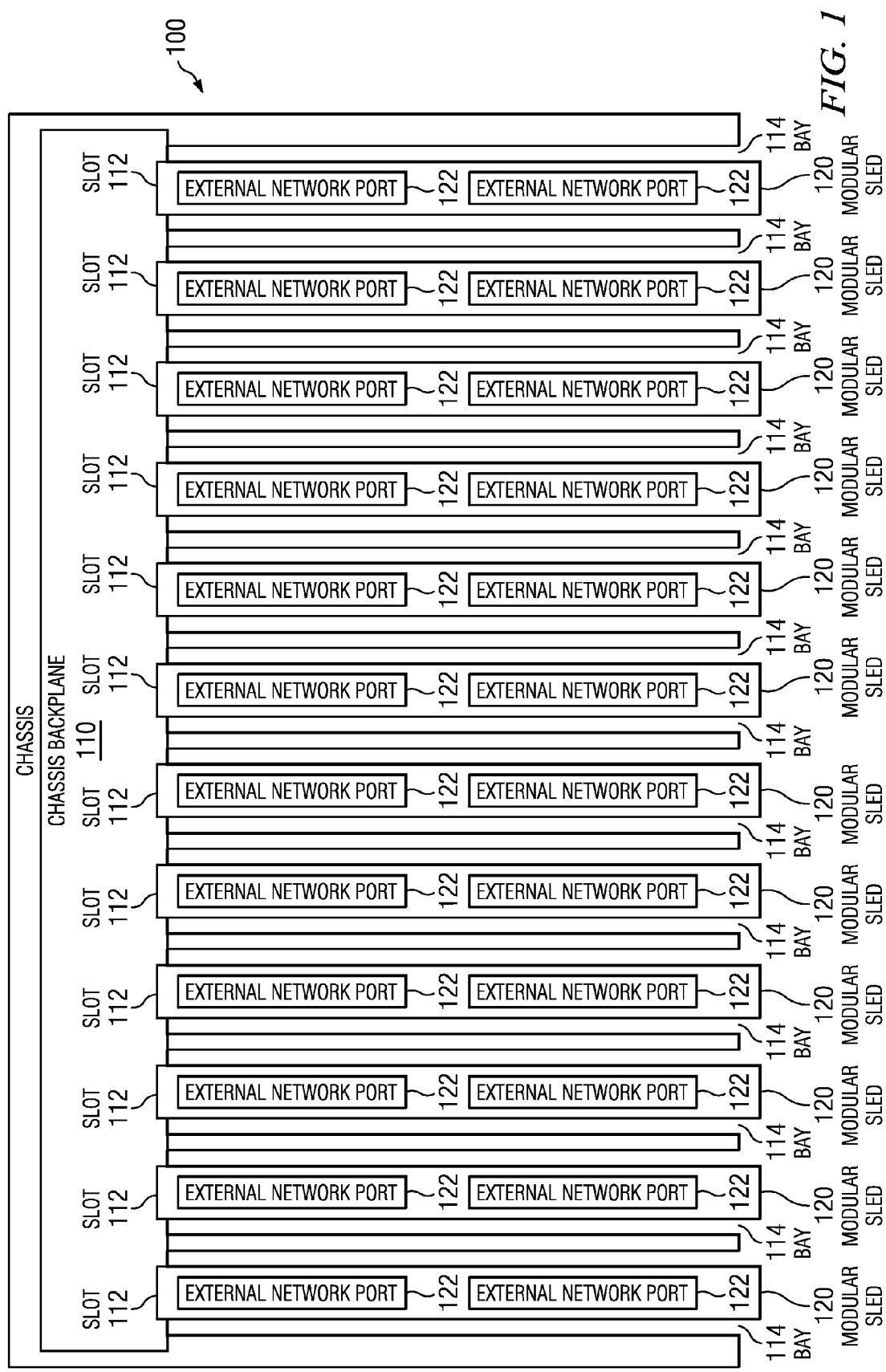
FIG. 1 illustrates a block diagram of an example system chassis configured to receive a plurality of server sleds, in accordance with embodiments of the present disclosure.

FIG. 1 illustrates a block diagram of an example system chassis 100 configured to receive a plurality of server sleds 120, in accordance with embodiments of the present disclosure. As depicted in FIG. 1, chassis 100 may include a chassis backplane 110 and a plurality of bays 114. Chassis backplane 110 may comprise any system, device, or apparatus configured to interconnect modular server sleds 120 with each other and to other information handling resources of chassis 100, as described in greater detail below. Accordingly, chassis backplane 110 may include slots 112 and/or other connectors configured to receive corresponding electrical connectors of modular sleds 120 in order to electrically couple information handling systems and information handling resources of modular sleds 120 to chassis backplane 110.

A bay 114 may include a suitable combination of structural elements configured to mechanically mate with a modular sled 120 to allow components of modular sled 120 to remain electrically coupled to chassis backplane 110 when modular sled 120 is engaged with chassis 100. A bay 114 may also be configured to allow modular sleds 120 to be easily inserted and removed from the bay 114 as desired by a user.

Figure 2:
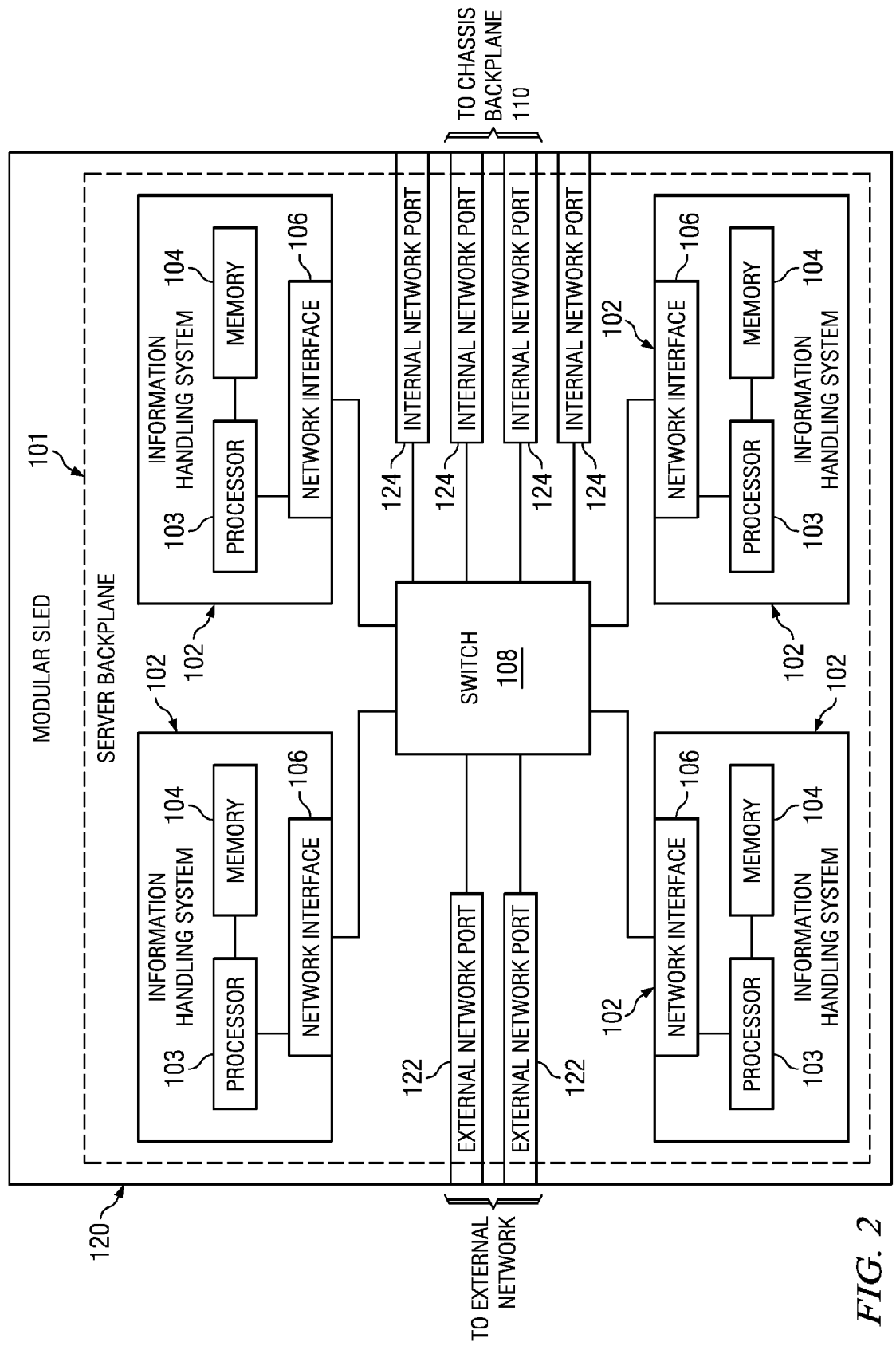
FIG. 2 illustrates a block diagram of selected components of a server sled, in accordance with embodiments of the present disclosure.

FIG. 2 illustrates a block diagram of selected components of a server sled 120, in accordance with embodiments of the present disclosure. As depicted in FIG. 2, a modular sled 120 may comprise a server backplane 101. Server backplane 101 may comprise a collection of electrically conductive paths, connectors, and/or other electrical elements configured to electrically couple various information handling systems 102 and/or information handling resources of modular sled 120 to each other. In some embodiments, server backplane 101 may comprise a motherboard. As shown in FIG. 2, server backplane 101 may comprise one or more information handling systems 102, a switch 108, one or more external network ports 122, and internal network ports 124.

An information handling system 102 may generally be operable to receive data from and/or communicate data to one or more other information handling systems 102, other information handling resources of chassis 100, and/or a network external to chassis 100. In certain embodiments, an information handling system 102 may be a server. As depicted in FIG. 1, an information handling system 102 may include a processor 103, a memory 104 communicatively coupled to processor 103, and a network interface 106 communicatively coupled to processor 103.

A processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of chassis 100.

A memory 104 may be communicatively coupled to an associated processor 103 and may include any system, device, or apparatus configured to retain program instructions and/or data for a period of time (e.g., computer-readable media). A memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to chassis 100 is turned off.

A network interface 106 may be any suitable system, apparatus, or device operable to serve as an interface between its associated information handling system 102 and switch 108. Each network interface 106 may enable its respective host 102 to communicate over network 110 using any suitable transmission protocol and/or standard, including without limitation all transmission protocols and/or standards enumerated below with respect to the discussion of the external network and/or chassis backplane network described in greater detail below. In certain embodiments, network interface card 106 may comprise a network interface card, or "NIC."

Switch 108 may be any suitable system, apparatus, or device configured to communicatively couple information handling systems 102 to each other, to a chassis backplane network (e.g., via internal network ports 124), and/or a network external to chassis 100 (e.g., via external network ports 122). In some embodiments, switch 108 may communicatively couple information handling systems 102, the chassis backplane network, and the network external to chassis 100 (collectively referred to as "network segments") and process data received from network segments and/or route data among the network segments at the data link layer (Layer 2) of the Open Systems Interconnection (OSI) model.

As shown in FIG. 2, switch 108 may be communicatively coupled to one or more external network ports 122. An external network port 122 may include any interface which may receive a cable or other connector by which elements of a network external to chassis 100 (e.g., server backplanes present in other chassis, higher-level switches or routers, etc.) may be communicatively coupled to server backplane 101, thus facilitating communication of information handling systems 102 present in chassis 100 (whether such information handling systems are present on the server backplane 101 directly coupled to the external network or other information handling systems 102 present on other server backplanes 101 of other modular sleds 120 present in chassis 100). As shown in FIG. 1, external ports 122 may be arranged on a modular sled 120 such that when the modular sled 120 is engaged with chassis 100, external ports 122 are externally accessible to a user.

Also as depicted in FIG. 2, switch 108 may be communicatively coupled to one or more internal network ports 124. An internal network port 124 may include any interface configured to communicatively couple switch 108 to chassis backplane 110, such that server backplane 101 may communicatively couple to other server backplanes 101 of chassis 100, as described in greater detail below.

Figure 3A:
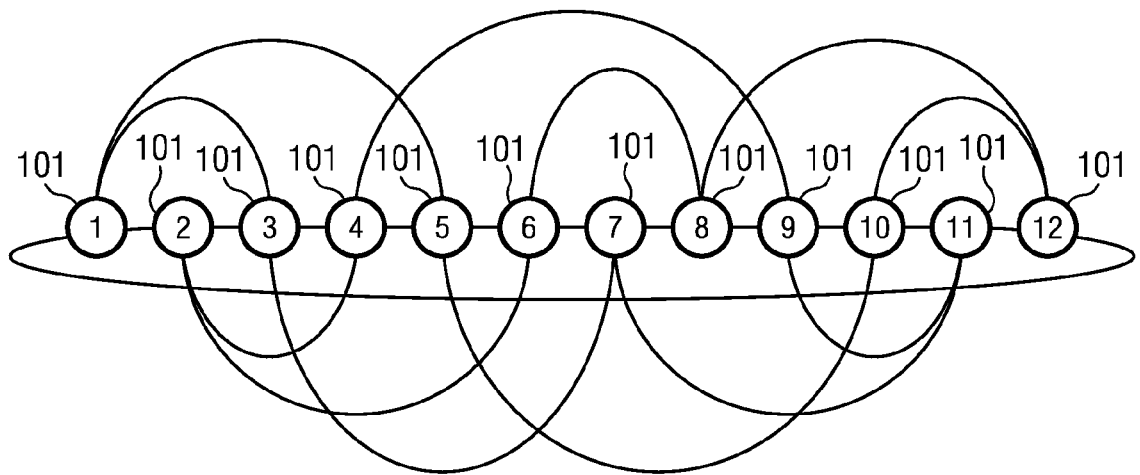
FIGS. 3A and 3B illustrate block diagrams of example chassis backplane topologies for coupling server backplanes, in accordance with embodiments of the present disclosure.
Figure 3B:
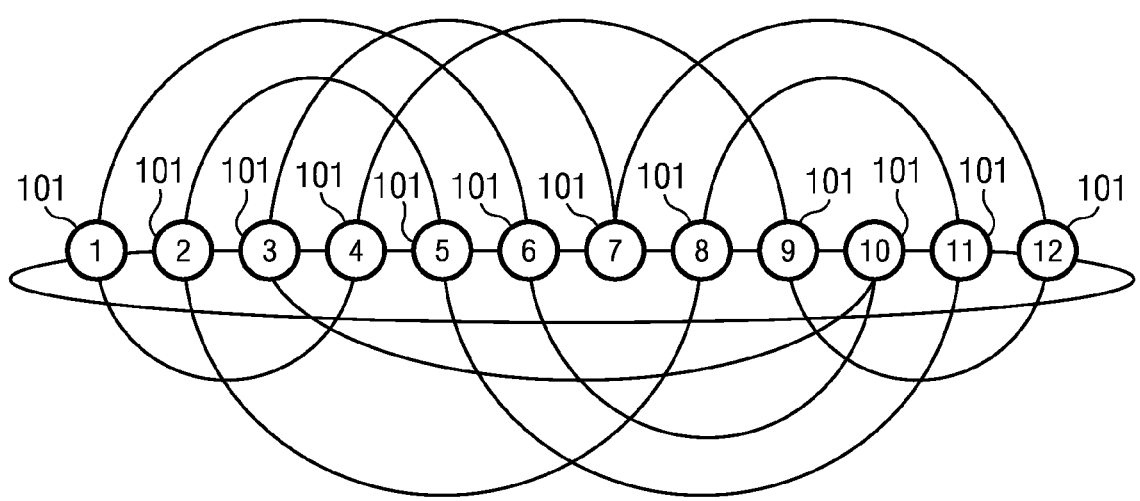

FIGS. 3A and 3B illustrate block diagrams of example chassis backplane topologies for coupling server backplanes, in accordance with embodiments of the present disclosure. Each of FIGS. 3A and 3B depict example topologies for embodiments of chassis 100 in which chassis 100 is configured to receive 12 modular sleds 120. Although FIGS. 1, 3A, and 3B depict chassis 100 as configured to receive 12 modular sleds 120, it is understood that chassis 100 may include any suitable number of modular sleds 120.

Each of FIGS. 3A and 3B depict example routings by chassis backplane 110 between internal network ports 124 of server backplanes 101 engaged with chassis 100. In the embodiments depicted in FIGS. 2, 3A and 3B, each server backplane 101 has four internal ports 124, and thus may couple to up to four other server backplanes 101 present in chassis 100. Although FIGS. 2, 3A, and 3B depict each server backplane 101 as having four internal ports 124, it is understood that a server backplane 101 may have any suitable number of internal ports. As shown in example topologies of FIGS. 3A and 3B, chassis backplane 110 may be configured such that each server backplane 101 is coupled to its physically adjacent server backplane 101 (server backplanes 101 labeled as 1 and 12 in FIGS. 3A and 3B may be considered adjacent for this purpose) as well as two other non-adjacent server backplanes 101. As a specific example, in FIG. 3A, server backplane 101 labeled 4 may be communicatively coupled to adjacent server backplanes 101 labeled 3 and 5, as well as non-adjacent server backplanes labeled 2 and 9.

By coupling server backplanes 101 to each other via chassis backplane 110, the respective switches 108 on server backplanes 101 coupled to each other may be communicatively coupled to each other. As a result, chassis backplane 110, the various switches 108 of the server backplanes 101 engaged with chassis 100, and the information handling systems 102 present on such server backplanes 101 engaged with chassis 100 may form a mesh network for which information handling systems 102 may be able to communicate with one another. In some embodiments, such mesh network may comprise an Ethernet Local Area Network (LAN). Thus, in operation, as modular sleds 120 are engaged with or removed from chassis 100, information handling systems 102 and/or switches 108 may, in accordance with known protocols and/or standards (e.g., Open Shortest Path First) discover other elements of its chassis network and build appropriate routing tables for communicating data among the various components of chassis 100.

In addition, one or more external networks may be coupled to the internal chassis network via one or more external ports 122, thus allowing information handling systems 102 and/or switches 108 of the internal chassis network to communicate to such external networks. For example, if all bays 114 are populated with a modular sled 120, the server backplane 101 for each modular sled 120 is functional, and at least one external port 122 from a server backplane 101 is coupled to an external network, each information handling system 102 and switch 108 should be able to reach the external network via the internal chassis network. To create redundancy in case of failure or removal of a server backplane 101 directly coupled to an external network via an external port 122, a plurality of external ports 122 may be coupled to the external network.

Advantageously, the routing topology of chassis backplane 110 may also create redundant paths between information handling systems 102 and switches 108 of server backplanes 101 engaged with chassis 100 so that removal or failure of a server backplane 101 does not prevent information handling systems 102 and switches 108 of server backplanes 101 engaged with chassis 100 from communicating with each other. Thus, the internal chassis network does not have a single point of failure provided a minimum number of server backplanes 101 are engaged with chassis 100.

In some embodiments, chassis backplane 110 may include a topology such that, when chassis 100 is fully populated, the longest communication path between any two server backplanes 101 is two, meaning that only a single intermediate server backplane 101 is communicatively interfaced between such two server backplanes 101 (e.g., the path distance is one to the intermediate server backplane 101, and two to the desired target server backplane 101).

In the event chassis 100 is not fully populated, an information handling system 102, a switch 108, chassis backplane 110, or another component of a server backplane 101 engaged with chassis 100 may detect which bays 114 are without modular sleds 120 and may route network paths based on chassis population and topology of chassis backplane 110. In addition or alternatively, for configurations in which chassis 100 is not fully populated, an information handling system 102, a switch 108, chassis backplane 110, may report (e.g., via a user interface) unsupported configurations (e.g., those in which a single point of failure may be present) and/or recommend optional configuration (e.g., a configuration including the shortest paths between all possible pairs of switches) based on the number of bays 114 populated and the topology of chassis backplane 110.

The internal chassis network and/or the external network described herein may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or any other appropriate architecture or system that facilitates the communication of signals, data and/or messages (generally referred to as data). The internal chassis network and/or the external network may transmit data using any storage and/or communication protocol, including without limitation, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Although the present disclosure has been described in detail, it should be understood that various changes, substitutions, and alterations can be made hereto without departing from the spirit and the scope of the disclosure as defined by the appended claims.

What is claimed is:

1. A system comprising:
a plurality of server backplanes, each of the plurality of server backplanes integral to a respective modular sled configured to removably engage with the chassis, the server backplane comprising:
   a plurality of information handling systems;
   a switch communicatively coupled to each of the plurality of information handling systems;
   at least one external network port communicatively coupled to the switch for coupling the switch to an external network external to the chassis; and
   a plurality of internal network ports communicatively coupled to the switch;
a chassis configured to receive the plurality of server backplanes; and
a chassis backplane integral to the chassis, the chassis backplane having a topology configured to couple the switch from each of the plurality of server backplane to switches from two or more other of the plurality of server backplanes such that an internal chassis network is formed comprising the information handling systems and switches of the plurality of server backplanes engaged with the chassis.

2. A system according to claim 1, the chassis backplane configured such that when a minimum number of server backplanes are engaged with the chassis, no single point of failure exists within the internal chassis network that would prevent a non-failed switch from one server backplane from communicating with a non-failed switch from another server backplane.

3. A system according to claim 1, wherein the plurality of internal network ports on each of the plurality of server backplanes comprises four internal network ports, and the topology of the chassis backplane is configured such that the switch from each server backplane is communicatively coupled to the switches from four other server backplanes when a maximum number of server backplanes are engaged with the chassis.

4. A system according to claim 3, the topology of the chassis backplane configured such that each network path between any two switches comprises no more than one other intermediate switch when the maximum number of server backplanes are engaged with the chassis.

5. A system according to claim 1, the switch of each server backplane configured to, based on the topology of the backplane and a configuration of server backplanes engaged with the chassis, determine path routing among the switches of the server backplanes engaged with the chassis.

6. A system according to claim 1, the chassis configured to, when less than a maximum number of server backplanes are engaged with the chassis, report whether a configuration of server backplanes engaged with the chassis is supported by the chassis based on the topology of the chassis backplane.

7. A system according to claim 1, the chassis configured to, when less than a maximum number of server backplanes are engaged with the chassis, determine an optimum configuration of server backplanes based on the topology of the chassis backplane.

8. A server backplane configured to be carried on a modular sled for engagement with a chassis, the server backplane comprising:
   a plurality of information handling systems;
   a switch communicatively coupled to each of the plurality of information handling systems;
   at least one external network port communicatively coupled to the switch for coupling the switch to an external network external to the chassis; and
   a plurality of internal network ports communicatively coupled to the switch, the plurality of internal network ports configured to communicatively coupled to a chassis backplane integral to the chassis, the chassis backplane having a topology configured to couple the switch from each server backplane to switches from two or more other server backplanes such that an internal chassis network is formed comprising the information handling systems and switches of the plurality of server backplanes engaged with the chassis.

9. A server backplane according to claim 8, the chassis backplane configured such that when a minimum number of server backplanes are engaged with the chassis, no single point of failure exists within the internal chassis network that would prevent a non-failed switch from one server backplane from communicating with a non-failed switch from another server backplane.

10. A server backplane according to claim 8, wherein the plurality of internal network ports on each of the plurality of server backplanes comprises four internal network ports, and the topology of the chassis backplane is configured such that the switch from each server backplane is communicatively coupled to the switches from four other server backplanes when a maximum number of server backplanes are engaged with the chassis.

11. A server backplane according to claim 10, the topology of the chassis backplane configured such that each network path between any two switches comprises no more than one other intermediate switch when the maximum number of server backplanes are engaged with the chassis.

12. A server backplane according to claim 8, the switch of each server backplane configured to, based on the topology of the backplane and a configuration of server backplanes engaged with the chassis, determine path routing among the switches of the server backplanes engaged with the chassis.

13. A server backplane according to claim 8, the server backplane configured to, when less than a maximum number of server backplanes are engaged with the chassis, report whether a configuration of server backplanes engaged with the chassis is supported by the chassis based on the topology of the chassis backplane.

14. A system according to claim 8, the server backplane configured to, when less than a maximum number of server backplanes are engaged with the chassis, determine an optimum configuration of server backplanes based on the topology of the chassis backplane.

\* \* \* \* \*